United States Patent
Johnson et al.

(10) Patent No.: US 11,181,765 B2
(45) Date of Patent: Nov. 23, 2021

(54) SYSTEM AND METHOD TO HEAT LCDS USING UV LEDS

(71) Applicant: Rockwell Collins, Inc., Cedar Rapids, IA (US)

(72) Inventors: Ricky J Johnson, Shellsburg, IA (US); Blake P Covington, Mount Vernon, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 0 days.

(21) Appl. No.: 17/215,470

(22) Filed: Mar. 29, 2021

(65) Prior Publication Data

US 2021/0302780 A1    Sep. 30, 2021

Related U.S. Application Data

(60) Provisional application No. 63/001,106, filed on Mar. 27, 2020.

(51) Int. Cl.
| | | |
|---|---|---|
| *G02F 1/1333* | (2006.01) | |
| *H05K 7/20* | (2006.01) | |
| *H05B 6/00* | (2006.01) | |

(52) U.S. Cl.
CPC ........... *G02F 1/133382* (2013.01); *H05K 7/20954* (2013.01); *H05B 6/00* (2013.01)

(58) Field of Classification Search
CPC .......... G02F 1/133382; H05K 7/20954; H05B 6/00
See application file for complete search history.

(56) References Cited

U.S. PATENT DOCUMENTS

| | | | |
|---|---|---|---|
| 4,634,225 A | 1/1987 | Haim et al. | |
| 4,987,289 A | 1/1991 | Bishop et al. | |
| 5,694,191 A | 12/1997 | Strathman et al. | |
| 5,936,696 A * | 8/1999 | Daijogo ............ | G02F 1/133509 349/161 |
| 7,036,946 B1 * | 5/2006 | Mosier .............. | G02F 1/133617 349/68 |
| 7,916,264 B2 | 3/2011 | Chen et al. | |
| 9,104,058 B2 | 8/2015 | Shives et al. | |
| 2019/0196272 A1 | 6/2019 | Johnson | |

* cited by examiner

*Primary Examiner* — Donald L Raleigh
(74) *Attorney, Agent, or Firm* — Suiter Swantz pc llo

(57) ABSTRACT

An inexpensive system for maintaining an LCD display above an operative temperature includes ultraviolet (UV) light-emitting diodes (LEDs) incorporated into a backlight structure. The UV LEDs operate in a frequency range sufficiently removed from the visible band to not interfere with the user. A temperature sensor continuously or periodically monitors the temperature of the LCD and activates the UV LEDs to maintain the LCD in a predetermined temperature range for a desired response time.

15 Claims, 5 Drawing Sheets

SYSTEM AND METHOD TO HEAT LCDS USING UV LEDS

PRIORITY

The present application claims the benefit under 35 U.S.C. § 119(e) of U.S. Provisional App. No. 63/001,106 (filed Mar. 27, 2020), which is incorporated herein by reference.

BACKGROUND

In an avionics environment, liquid crystal displays (LCDs) are required to work down to −40° C. Current low temperature response times are insufficient, so LCDs in an avionics environment must be heated. Currently, indium-tin-oxide (ITO) heaters are used to heat LCDs. ITO is a transparent conductor that is deposited on glass and bonded to the LCD stack. ITO heaters are expensive, reduce display transmission by 20%, require complex electrical connections, and have a limited supply chain that may produce a production bottleneck.

Infrared (IR) sources may be used for radiative heat but are also not ideal: IR interferes with night vision goggles or low-light systems, LCDs are relatively transparent to IR so don't absorb heat efficiently, and the diffuser and other film layers do absorb IR before it gets to the LCD. Furthermore, IR sources are not efficient.

SUMMARY

In one aspect, embodiments of the inventive concepts disclosed herein are directed to an inexpensive system for maintaining an LCD display above an operative temperature. Ultraviolet (UV) light-emitting diodes (LEDs) are incorporated into a backlight structure. The UV LEDs operate in a frequency range sufficiently removed from the visible band to not interfere with the user.

In a further aspect, a temperature sensor continuously or periodically monitors the temperature of the LCD and activates the UV LEDs to maintain the LCD in a predetermined temperature range for a desired response time.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
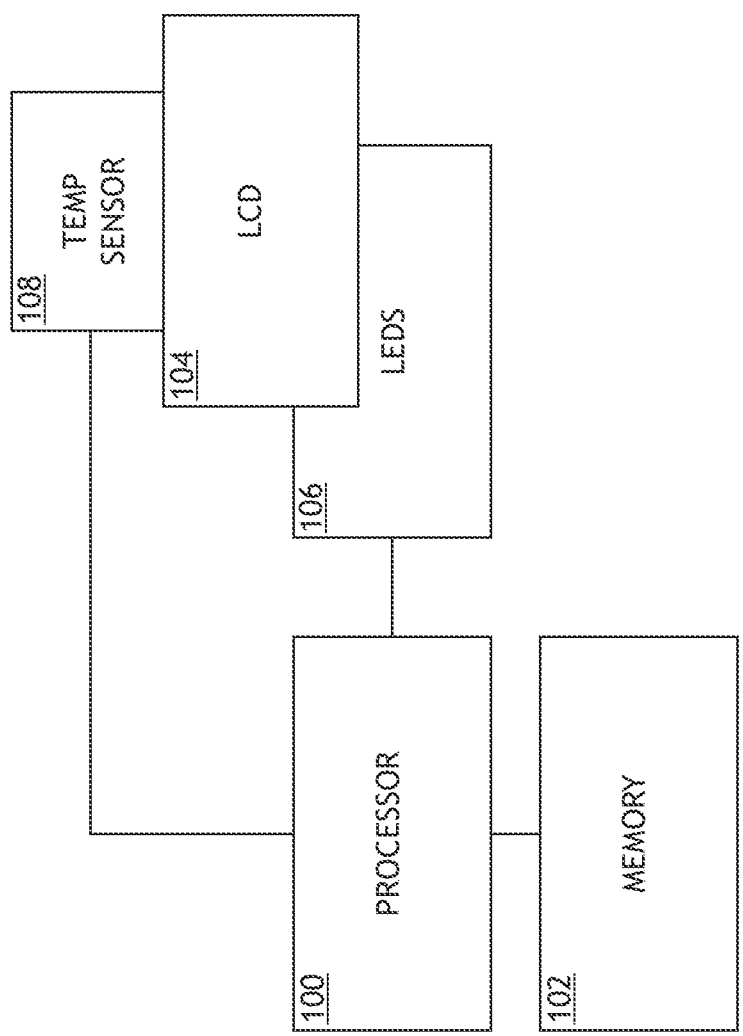
FIG. 1 shows a block diagram of a system useful for implementing an exemplary embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to an inexpensive system for maintaining an LCD display above an operative temperature. UV LEDs are incorporated into a backlight structure. The UV LEDs operate in a frequency range at the edge of the visible band where the eye is not very sensitive and over 99% of the UV energy is absorbed by the LCD This ensures that the UV energy will not interfere with the user.

Referring to FIG. 1, a block diagram of a system useful for implementing an exemplary embodiment is shown. The system includes a processor 100 and memory 102 for storing processor executable code. The processor 100 is in data communication with an LCD device including at least an LCD layer 104 and an LED backlight layer 106.

The LED backlight layer 106 comprises visible light LEDs and UV LEDs. The processor 100 may activate the visible light LEDs continuously or as dictated by the necessity of illuminating the LCD layer 104 for use. Independently of the visible light LEDs, the processor 100 may activate the UV LEDs to warm the LCD layer 104. In at least one embodiment, the processor 100 activates the UV LEDs periodically to maintain the temperature of the LCD. Alternatively, or in addition, the processor 100 may determine that the LCD device is in a startup sequence and activates the UV LEDs for the duration of that startup sequence. Alternatively, or in addition, the processor 100 may limit UV LED activation to periods where the visible light LEDs are inactive.

In at least one embodiment, the processor 100 is in data communication with a temperature sensor 108 configured to measure the temperature of the LCD 104. The processor 100 may receive temperature values form the temperature sensor 108 and activate the UV LEDs whenever the temperature falls below a predefined value to maintain the LCD 104 in an operational temperature range. Likewise, the processor 100 may deactivate the UV LEDs when the temperature value rises above a predefined value.

In at least one embodiment, the processor 100 may track temperature changes via the temperature sensor 108 over time. The processor 100 may determine a relation between a current temperature and a rate of temperature change. When the rate of change and current temperature exceeds a threshold, the processor 100 may activate the UV LEDs. For example, where the temperature is determined to be dropping quickly, the processor 100 may activate the UV LEDs while the current temperature is still above a threshold temperature. The UV LEDs may transmit heat to the LCD at a known rate; therefore the processor 100 may beginning heating the LCD to prevent the temperature falling below the threshold temperature.

Figure 2:
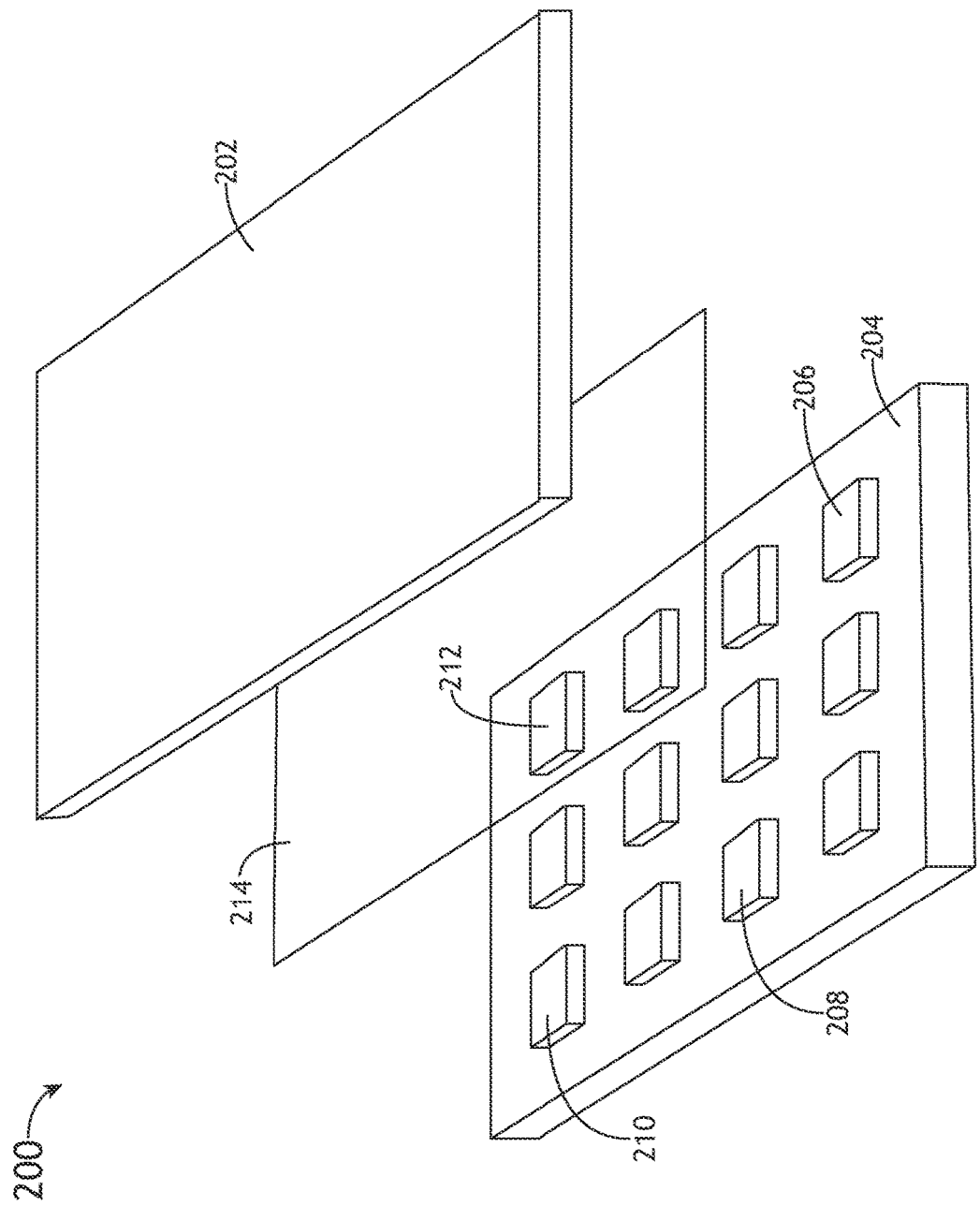
FIG. 2 shows a perspective, exploded representation of an LCD device according to an exemplary embodiment.

Referring to FIG. 2, a perspective, exploded representation of an LCD device 200 according to an exemplary embodiment is shown. The LCD device 200 comprises an LCD layer 202 and a backlight layer 204; the backlight layer 204 may comprise a printed wiring board. The backlight layer 204 comprises a plurality of LEDs 206, 208, 210, 212. A first set of the LEDs 206, 210 are configured to produce visible light while a second set of LEDs are configured to produce UV light 208, 212. The first set of LEDs 206, 210 and second set of LEDs 208, 212 are separately addressable.

In at least one embodiment, the second set of LEDs 208, 212 are disposed periodically on the backlight layer 204 to substantially uniformly illuminate (and thereby heat) the LCD layer 202. Alternatively, the disposition of the second set of LEDs 208, 212 may be weighted to the periphery of the LCD layer 202 to heat the LCD layer 202 but minimize visual interference. Alternatively, the second set of LEDs 208, 212 may be disposed randomly as dictated by a manufacturing process.

On at least one embodiment, the second set of LEDs 208, 212 may be disposed with a density no greater than one UV LED 208, 212 per square inch (about one UV LED per six square centimeters).

The LCD device 200 may comprise various interstitial layers 214 such as diffusers and films. UV light may have a generally deleterious impact on those interstitial layers 214 and is therefore limited by activating the UV LEDs 208, 212 only when necessary to maintain the LCD layer 202 at an operative temperature.

Figure 3:
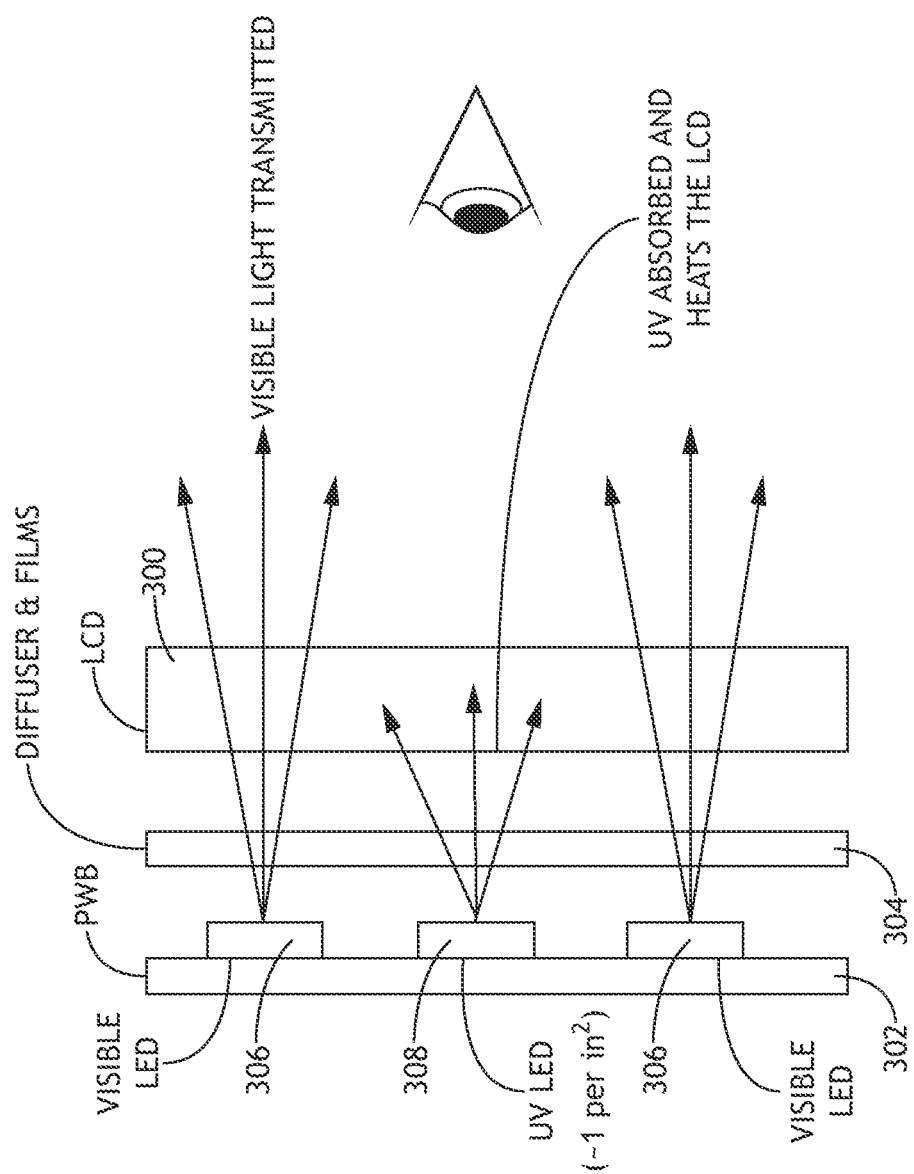
FIG. 3 shows a detail, side view of an LCD device according to exemplary embodiment.

Referring to FIG. 3, a detail, side view of an LCD device according to exemplary embodiment is shown. The LCD device includes an LCD layer 300 and a backlight layer 302 having a plurality of LEDs 306, 308. The plurality of LEDs 306, 308 includes visible light LEDs 306 disposed to backlight the LCD layer 300, and UV LEDs 308 disposed to warm the LCD layer 300 as necessary. The UV LEDs 308 are configured to operate in a wavelength that passes through a diffuser and other interstitial film layers 304 and is absorbed by the LCD layer 300. In at least one embodiment, the operational wavelength of the UV LEDs 308 is between 375 nm and 425 nm.

Figure 4:
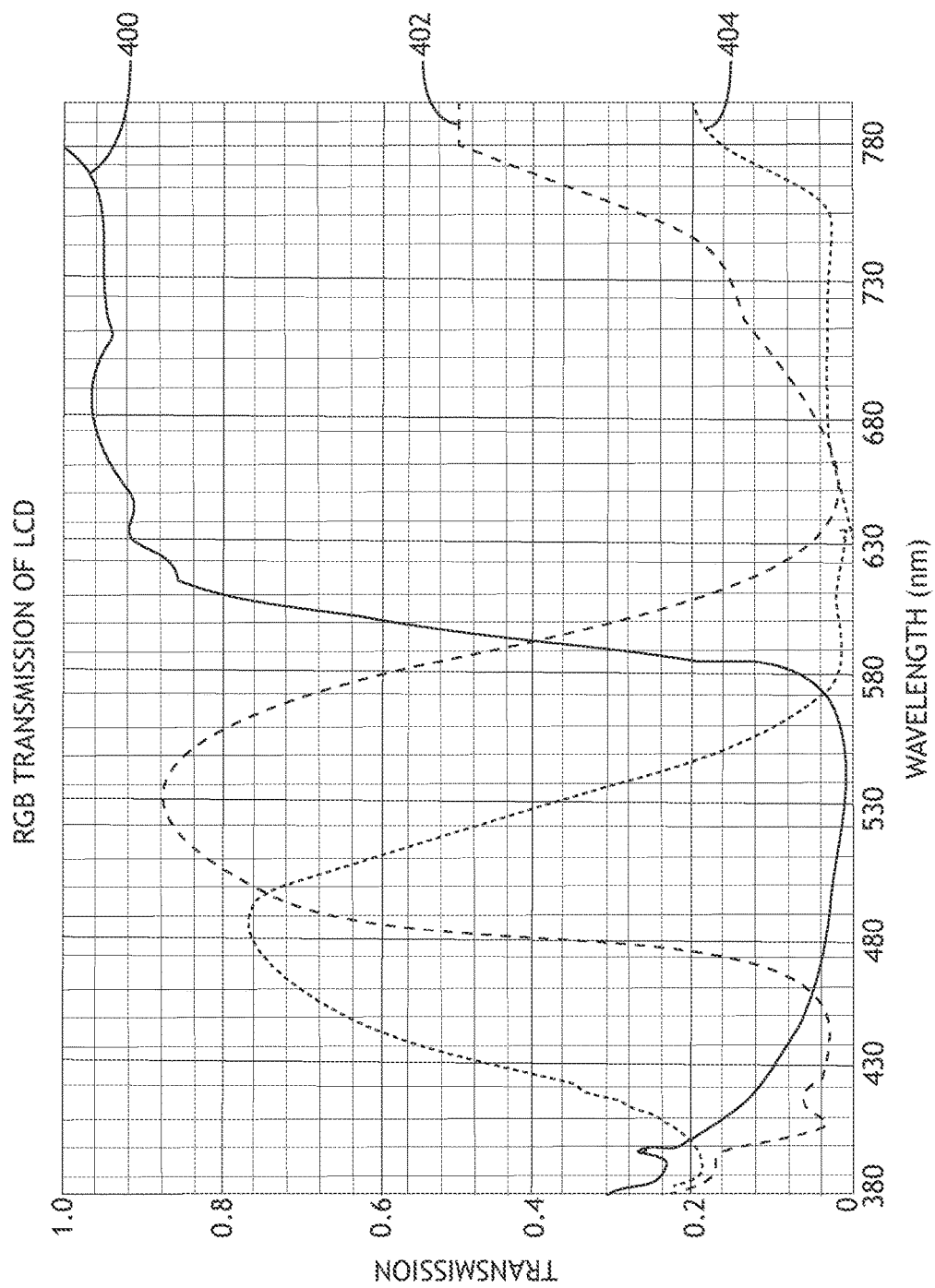
FIG. 4 shows a graph of wavelength transmission through an LCD.
Figure 5:
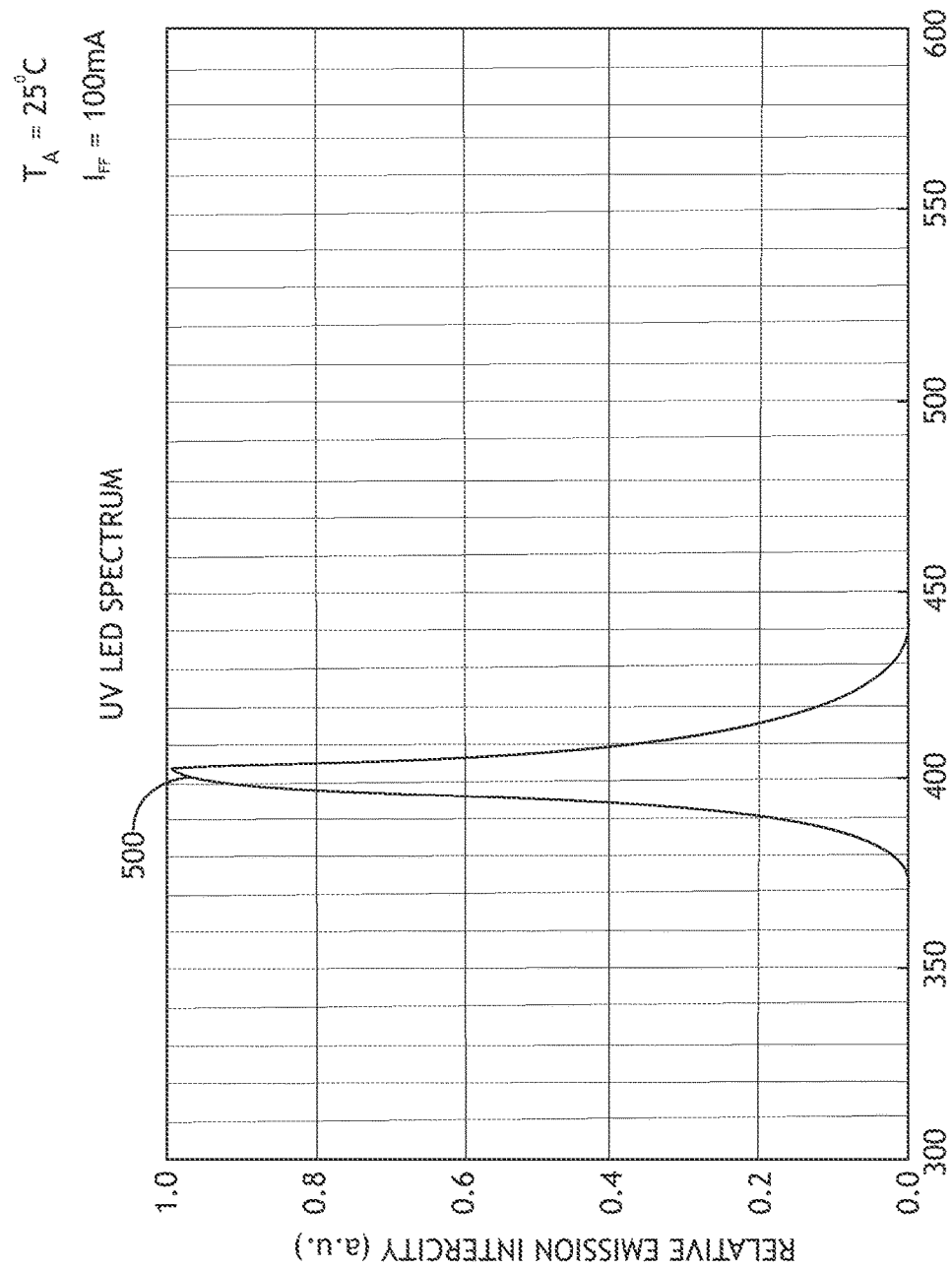
FIG. 5 shows a graph of UV LED operating wavelengths.

Referring to FIGS. 4 and 5, graphs of wavelength transmission through an LCD and UV LED operating wavelengths are shown. Visible light LEDs in an LCD backlight layer generally produce wavelengths corresponding to red light 400, green light 402 and blue light 404. Those wavelengths are transmitted through an LCD layer with various degrees of efficiency according to the wavelength. By comparison, light in UV wavelengths 500 may be in a band of variable transmission through the LCD layer. In at least one embodiment, UV LEDs are configured to operate in a UV band to limit transmission through the LCD layer and maximize heat transfer within that band. Limiting the UV wavelength to a band of highest absorption (approximately 99%) may limit the amount of UV light exposed to the pilot/user.

In at least one embodiment, UV LEDs may operate at 50% to 75% efficiency; substantially higher than IR LEDs.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. An liquid-crystal display (LCD) device comprising:
   an LCD layer; and
   a backlight layer comprising a plurality of light-emitting diodes (LEDs),
   wherein the plurality of LEDS comprises:
      a set of visible light LEDs; and
      a set of ultraviolet (UV) LEDs disposed on the backlight layer to substantially uniformly heat the LCD layer.

2. The LCD device of claim 1; wherein the UV LEDs are configured to operate within a wavelength range between 375 nm and 425 nm.

3. The LCD device of claim 1; wherein the UV LEDs are disposed among the visible light LEDs at a density of no more than one UV LEDs per six square centimeters of backlight layer.

4. The LCD device of claim 1; further comprising at least one processor in data communication with a memory storing processor executable code for configuring the at least one processor to periodically activate the UV LEDs for a period of time.

5. The LCD device of claim 4; further comprising a temperature sensor in data communication with the at least one processor, where in the at least one processor is further configured to:
   receive a temperature value form the temperature sensor; and
   activate the UV LEDs when the temperature value is below a defined threshold.

6. The LCD device of claim 4; further comprising a temperature sensor in data communication with the at least one processor, where in the at least one processor is further configured to:
   continuously receive temperature values from the temperature sensor; and
   activate the UV LEDs based on a relation of a current temperature to a rate of temperature change and a known heating coefficient of the UV LEDs.

7. The LCD device of claim 4; further comprising a temperature sensor in data communication with the at least one processor, where in the at least one processor is further configured to:
   receive a temperature value from the temperature sensor; and
   deactivate the UV LEDs when the temperature value is above a defined threshold.

8. An avionics display system comprising:
   an liquid-crystal display (LCD) device comprising:
      an LCD layer; and
      a backlight layer comprising a plurality of light-emitting diodes (LEDs),
   wherein the plurality of LEDS comprises:
      a set of visible light LEDs; and
      a set of ultraviolet (UV) LEDs disposed on the backlight layer to substantially uniformly heat the LCD layer.

9. The avionics display system of claim 8; wherein the UV LEDs are configured to operate within a wavelength range between 375 nm and 425 nm.

10. The avionics display system of claim 8; wherein the UV LEDs are disposed among the visible light LEDs at a density of no more than one UV LEDs per six square centimeters of backlight layer.

11. The avionics display system of claim 8; further comprising at least one processor in data communication with a memory storing processor executable code for configuring the at least one processor to periodically activate the UV LEDs for a period of time.

12. The avionics display system of claim 11; where in the at least one processor is further configured to:
   determine that the avionics display system is in a startup sequence; and
   activate the UV LEDs until the startup sequence is concluded.

13. The avionics display system of claim 11; further comprising a temperature sensor in data communication with the at least one processor, where in the at least one processor is further configured to:
   receive a temperature value form the temperature sensor; and
   activate the UV LEDs when the temperature value is below a defined threshold.

14. The avionics display system of claim 11; further comprising a temperature sensor in data communication with the at least one processor, where in the at least one processor is further configured to:
   continuously receive temperature values from the temperature sensor; and
   activate the UV LEDs based on a relation of a current temperature to a rate of temperature change and a known heating coefficient of the UV LEDs.

15. The avionics display system of claim 11; further comprising a temperature sensor in data communication with the at least one processor, where in the at least one processor is further configured to:
   receive a temperature value from the temperature sensor; and
   deactivate the UV LEDs when the temperature value is above a defined threshold.

* * * * *